(12) United States Patent
Takizawa (10) Patent No.: US 8,294,335 B2
(45) Date of Patent: Oct. 23, 2012

(54) ULTRASONIC MOTOR

(75) Inventor: Hiroyuki Takizawa, Chofu (JP)

(73) Assignee: Olympus Corporation, Tokyo (JP)

( * ) Notice: Subject to any disclaimer, the term of this patent is extended or adjusted under 35 U.S.C. 154(b) by 112 days.

(21) Appl. No.: 12/875,277

(22) Filed: Sep. 3, 2010

(65) Prior Publication Data

US 2011/0057544 A1    Mar. 10, 2011

(30) Foreign Application Priority Data

Sep. 7, 2009   (JP) .................................. 2009-205870

(51) Int. Cl.
*H02N 2/04*   (2006.01)
(52) U.S. Cl. .......... 310/323.16; 310/323.01; 310/323.04
(58) Field of Classification Search ............... 310/323.01–323.21, 328
See application file for complete search history.

(56) References Cited

U.S. PATENT DOCUMENTS

| 2009/0072665 A1* | 3/2009 | Adachi et al. ............ 310/323.16 |
| 2010/0019621 A1* | 1/2010 | Funakubo et al. ........ 310/323.16 |

FOREIGN PATENT DOCUMENTS

JP    H9-117168    5/1997

* cited by examiner

*Primary Examiner* — Derek Rosenau
(74) *Attorney, Agent, or Firm* — Scully, Scott, Murphy & Presser, P.C.

(57) ABSTRACT

Elliptical vibrations are generated by combining longitudinal primary resonance vibrations resulting from expansion and contraction of a vibrator in a direction of a central axis and torsional secondary resonance vibrations or torsional tertiary resonance vibrations resulting from twisting of the vibrator around the central axis. A dimension ratio of a rectangle of the vibrator is set such that a resonance frequency of the longitudinal primary resonance vibrations and a resonance frequency of the torsional secondary resonance vibrations or the torsional tertiary resonance vibrations almost match. The vibrator includes a plurality of piezoelectric sheets. The longitudinal primary resonance vibrations and the torsional secondary resonance vibrations or the torsional tertiary resonance vibrations are generated because of formation of activation regions by polarization in a thickness direction of the piezoelectric sheets.

2 Claims, 9 Drawing Sheets

ULTRASONIC MOTOR

CROSS-REFERENCE TO RELATED APPLICATION

The present application is based upon and claims the benefit of priority from the prior Japanese Patent Application No. 2009-205870 filed on Sep. 7, 2009; the entire contents of which are incorporated herein by reference.

BACKGROUND OF THE INVENTION

1. Field of the Invention

The present invention relates to ultrasonic motors.

2. Description of the Related Art

Figure 1:
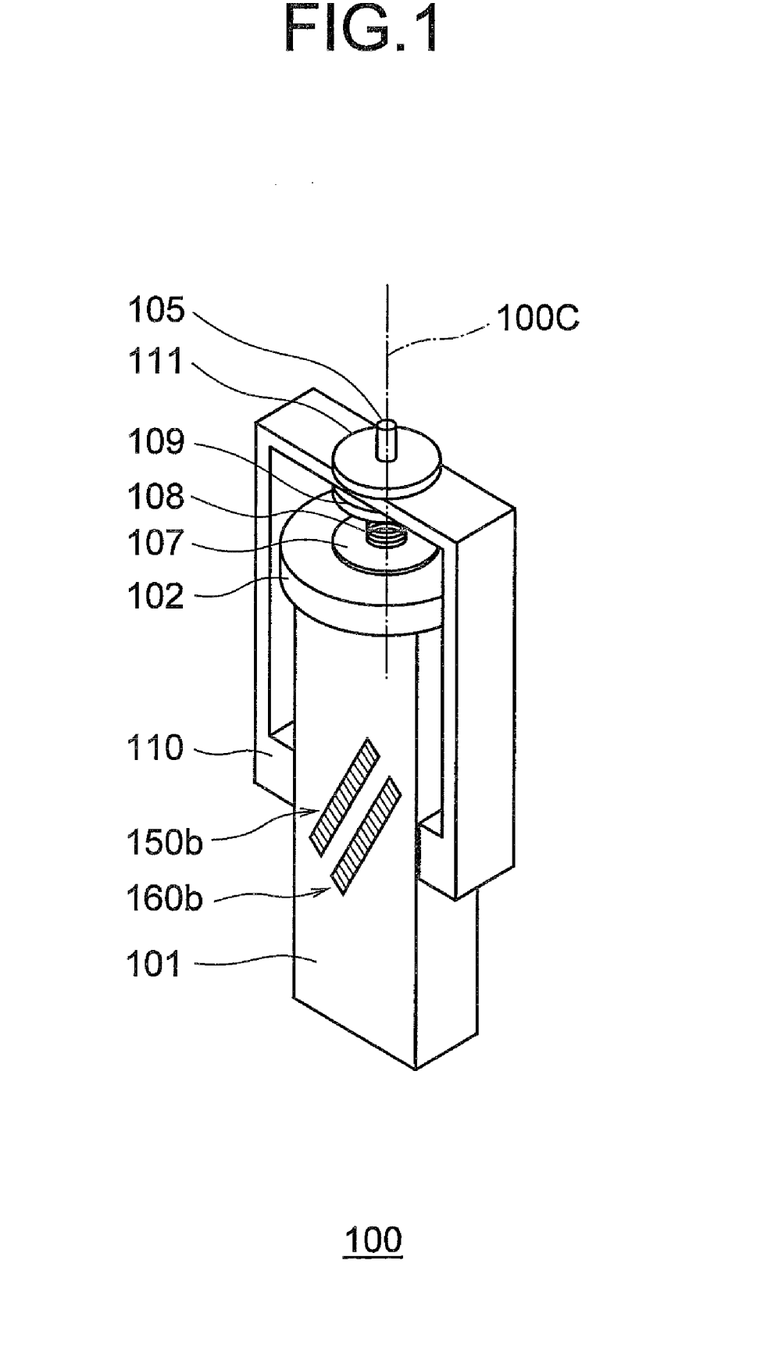
FIG. 1 is a perspective view of a structure of an ultrasonic motor according to a first embodiment of the present invention.

Japanese Patent Application Laid-open No. H9-117168, for example, discloses an ultrasonic motor that generates elliptical vibrations by combining longitudinal vibrations and torsional vibrations, and rotation drives a rotor. FIG. 1 of Japanese Patent Application Laid-open No. H9-117168 depicts an exploded perspective view of a vibrator. The vibrator has a structure in which a plurality of piezoelectric elements is arranged between elastic bodies that are cut obliquely with respect to an axis of the vibrator. Positive electrodes of the piezoelectric elements are divided into two groups. These groups will be called as Phase A and Phase B electrodes.

The longitudinal vibrations can be generated in the bar-shaped vibrator by applying alternating voltages of the same phase to both Phase A and Phase B electrodes. On the other hand, the torsional vibrations can be generated in the bar-shaped vibrator by applying alternating voltages of opposite phases to both Phase A and Phase B electrodes. A position of a groove in the vibrator is adjusted such that a resonance frequency of the longitudinal vibrations and a resonance frequency of the torsional vibrations substantially match. When alternating voltages that differ by n/2 phase are applied to Phase A and Phase B electrodes, the longitudinal vibrations and the torsional vibrations are generated simultaneously, thereby generating elliptical vibrations on a top surface of a bar-shaped elastic body. In this state, by pressing the rotor on the top surface of the bar-shaped elastic body, the rotor can be rotation driven in a clockwise direction (CW direction) or a counterclockwise direction (CCW direction).

The ultrasonic motor disclosed in Japanese Patent Application Laid-open No. H9-117168 has various drawbacks. For example, as shown in FIG. 1, both the piezoelectric element and the elastic body are necessary, the elastic body must be cut obliquely, and the groove must be made in a portion of the elastic body to match resonance frequencies of the longitudinal vibrations and the torsional vibrations. Thus, the overall structure of the conventional vibrator is very complicated.

SUMMARY OF THE INVENTION

The present invention is made in view of the above discussion, and it is an object of the present invention to provide an ultrasonic motor that is made from a single part, has a simple structure, has no groove or the like, in which longitudinal vibrations and torsional vibrations can be easily generated, and that drives a rotor by using elliptical vibrations obtained by combining the longitudinal vibrations and the torsional vibrations.

To solve the above problems and to achieve the above objects, an ultrasonic motor according to an aspect of the present invention includes a vibrator having a dimension ratio of a rectangle in a cross-section orthogonal to a central axis; and a rotor that contacts an elliptical vibrations generating surface of the vibrator and that is rotation driven around the central axis that is orthogonal to an elliptical vibrations generating surface. Elliptical vibrations are generated by combining longitudinal primary resonance vibrations resulting from expansion and contraction of the vibrator in a direction of the central axis and torsional secondary resonance vibrations or torsional tertiary resonance vibrations resulting from twisting of the vibrator around the central axis, the dimension ratio of the rectangle of the vibrator is set such that a resonance frequency of the longitudinal primary resonance vibrations and a resonance frequency of the torsional secondary resonance vibrations or the torsional tertiary resonance vibrations almost match, the vibrator includes a plurality of piezoelectric sheets, and the longitudinal primary resonance vibrations and the torsional secondary resonance vibrations or the torsional tertiary resonance vibrations are generated because of formation of activation regions by polarization in a thickness direction of the piezoelectric sheets.

In an ultrasonic motor according to another aspect of the present invention, the vibrator is obtained by stacking the piezoelectric sheets at a certain angle with respect to the central axis, a first internal electrode is arranged on each piezoelectric sheet among the piezoelectric sheets that is near a node of the torsional secondary resonance vibrations or the torsional tertiary resonance vibrations, and the activation regions are formed at least at places where the first internal electrodes mutually oppose each other.

In an ultrasonic motor according to still another aspect of the present invention, a second internal electrode is arranged on each piezoelectric sheet on which the first internal electrode is arranged, and activation regions that are polarized in mutually opposite directions are formed corresponding to each of the places where the first internal electrodes mutually oppose each other and places where the second internal electrodes mutually oppose each other.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE INVENTION

Exemplary embodiments of an ultrasonic motor according to the present invention are explained in detail below with reference to the accompanying drawings. The present invention is by no means limited to the following embodiments.

First Embodiment

Figure 2:
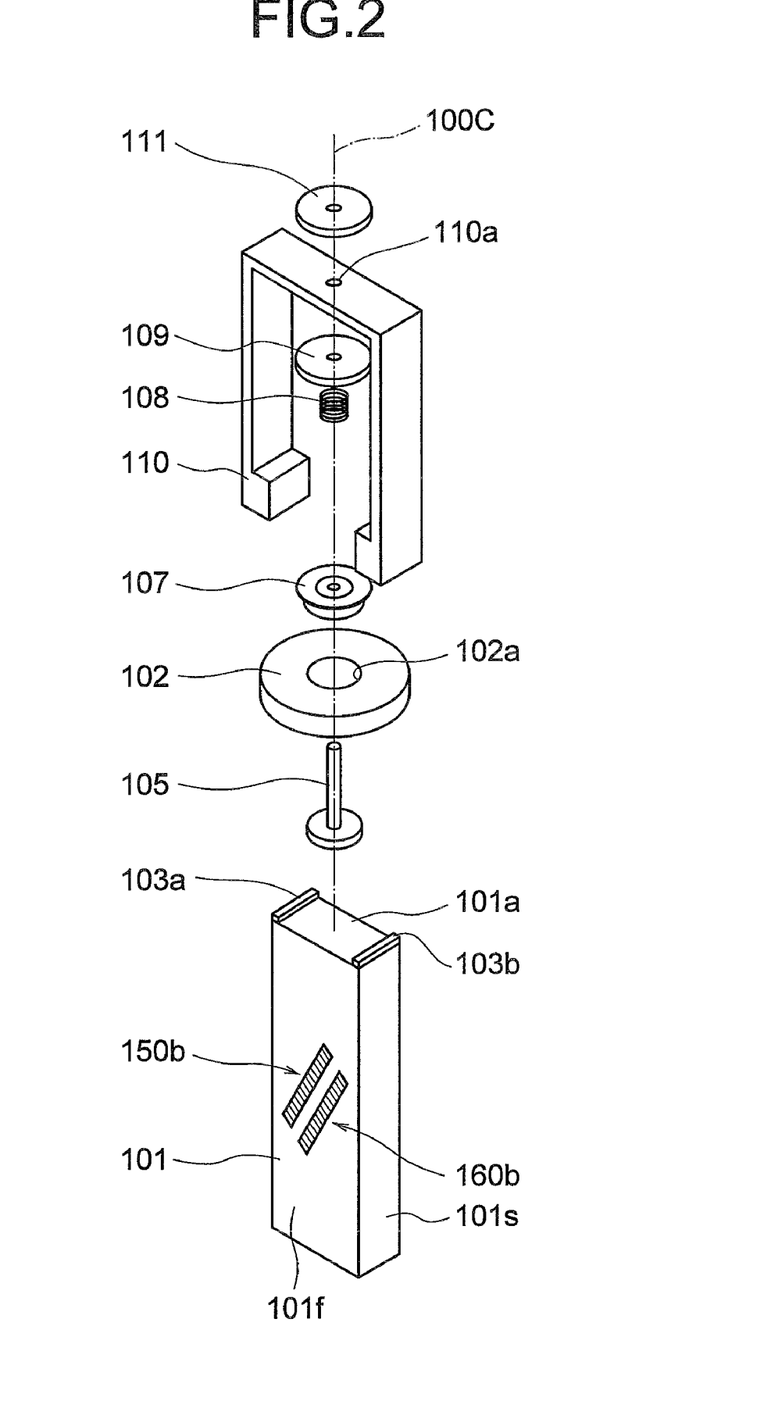
FIG. 2 is an exploded perspective view of the structure of the ultrasonic motor according to the first embodiment of the present invention.

FIG. 1 is a perspective view of a structure of an ultrasonic motor 100 according to the first embodiment of the present invention. FIG. 2 is an exploded perspective view of the structure of the ultrasonic motor 100.

The ultrasonic motor 100 includes a vibrator 101 and a rotor 102.

The vibrator 101 is a piezoelectric element of a substantially rectangular parallelepiped shape having a dimension ratio of a rectangle in a cross-section orthogonal to its central axis 100$c$ (rotation axis). The rotor 102 is substantially disk-shaped. A bottom surface of the rotor 102 contacts friction contact members 103$a$ and 103$b$ that are provided to an elliptical vibrations generating surface 101$a$ of the vibrator 101. The rotor 102 is rotation driven about the central axis 100$c$ that is orthogonal to the elliptical vibrations generating surface 101$a$ of the vibrator 101.

A structure for coupling the rotor 102 to the vibrator 101 is explained below.

A holder 110 is fixed near a node of the vibrator 101. A shaft 105, the rotor 102, a bearing 107, a spring 108, and a spring holding ring 109 are arranged in this order between the elliptical vibrations generating surface 101$a$ of the vibrator 101 and the holder 110. All these members are arranged on the central axis 100$c$.

The bearing 107 is engaged with a central hole 102$a$ of the rotor 102. The shaft 105 is made to pass through the central hole 102$a$ of the rotor 102 and a hole of the bearing 107 along the central axis 100$c$. A base of the shaft 105 rests on the elliptical vibrations generating surface 101$a$ of the vibrator 101.

The shaft 105, which penetrates the central hole 102$a$ of the rotor 102 and the hole of the bearing 107, passes through the spring 108 and a hole of the spring holding ring 109 in this order, and then passes through a through hole 110$a$ provided in an upper part of the holder 110. A ring 111 is threadably mounted on an upper tip of the shaft 105 that comes out of the through hole 110$a$. The shaft 105 is thus fixed to the holder 110.

The spring holding ring 109 and the shaft 105 are provided with threads, and the spring holding ring 109 is threadably mounted on the shaft 105. The position of the spring holding ring 109 on the shaft 105, i.e., a pressing force of the spring 108, can be adjusted by rotating the spring holding ring 109. In other words, a force by which the rotor 102 presses the friction contact members 103$a$ and 103$b$ can be adjusted by rotating the spring holding ring 109.

Figure 3A:
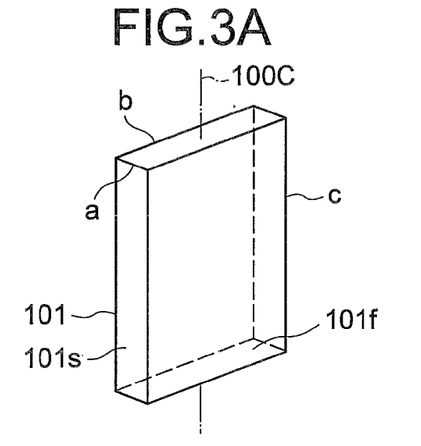
FIG. 3A is a perspective view of a schematic structure of a vibrator according to the first embodiment.
Figure 3B:
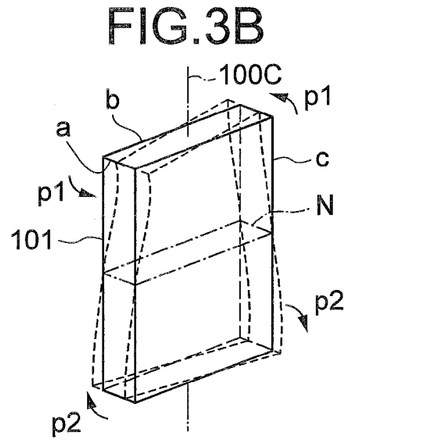
FIG. 3B is a perspective view that depicts with a dotted line a vibration state of the vibrator in a torsional primary vibration mode.

How resonance frequencies are matched in the vibrator 101 (piezoelectric element) included in the ultrasonic motor 100 is explained below while referring to FIGS. 3A to 3E and FIG. 4. FIG. 3A is a perspective view of a schematic structure of the vibrator 101. FIG. 3B is a perspective view that depicts with a dotted line a vibration state of the vibrator 101 in a torsional primary vibration mode. FIG. 3O is a perspective view that depicts with a dotted line a vibration state of the vibrator 101 in a longitudinal primary vibration mode. FIG. 3D is a perspective view that depicts with a dotted line a vibration state of the vibrator 101 in a torsional secondary vibration mode. FIG. 3E is a perspective view that depicts with a dotted line a vibration state of the vibrator 101 in a torsional tertiary vibration mode. FIG. 4 is a graph that depicts resonance frequencies of each of the modes when a height c of the vibrator is fixed and a parameter represented by a length of a short side/a length of a long side (a/b) is plotted on an axis of abscissa.

As shown in FIG. 3A, the vibrator 101 has a substantially rectangular parallelepiped shape. A length of a short side 101$s$ of a rectangular cross-section that is orthogonal to the central axis 100$c$ is denoted by a, a length of a long side 101$f$ is denoted by b, and a height of the vibrator 101 along the central axis 100$c$ is denoted by c. In the following explanation, a height direction of the vibrator 101 is assumed to be a direction of vibrations in the longitudinal primary vibration mode as well as an axis direction of torsion in the torsional vibrations. Moreover, a, b, and c satisfy a<b<c.

The resonance frequency in the longitudinal primary vibration mode and the resonance frequency in the torsional secondary vibration mode, or the resonance frequency in the longitudinal primary vibration mode and the resonance frequency in the torsional tertiary vibration mode can be matched by appropriately setting a, b, and c in the vibrator 101.

Figure 3C:
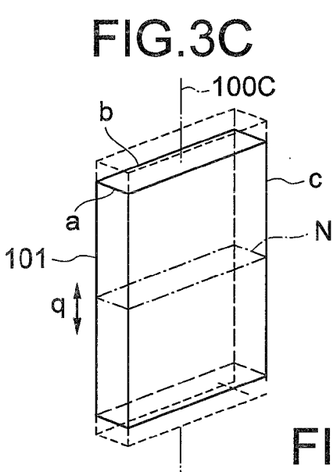
FIG. 3C is a perspective view that depicts with a dotted line a vibration state of the vibrator in a longitudinal primary vibration mode.
Figure 3D:
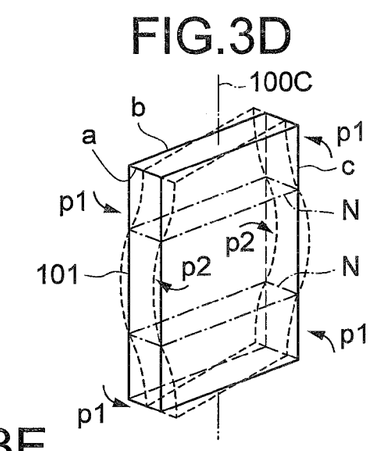
FIG. 3D is a perspective view that depicts with a dotted line a vibration state of the vibrator in a torsional secondary vibration mode.
Figure 3E:
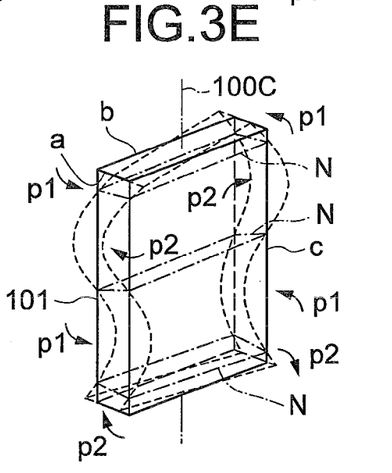
FIG. 3E is a perspective view that depicts with a dotted line a vibration state of the vibrator in a torsional tertiary vibration mode.
Figure 4:
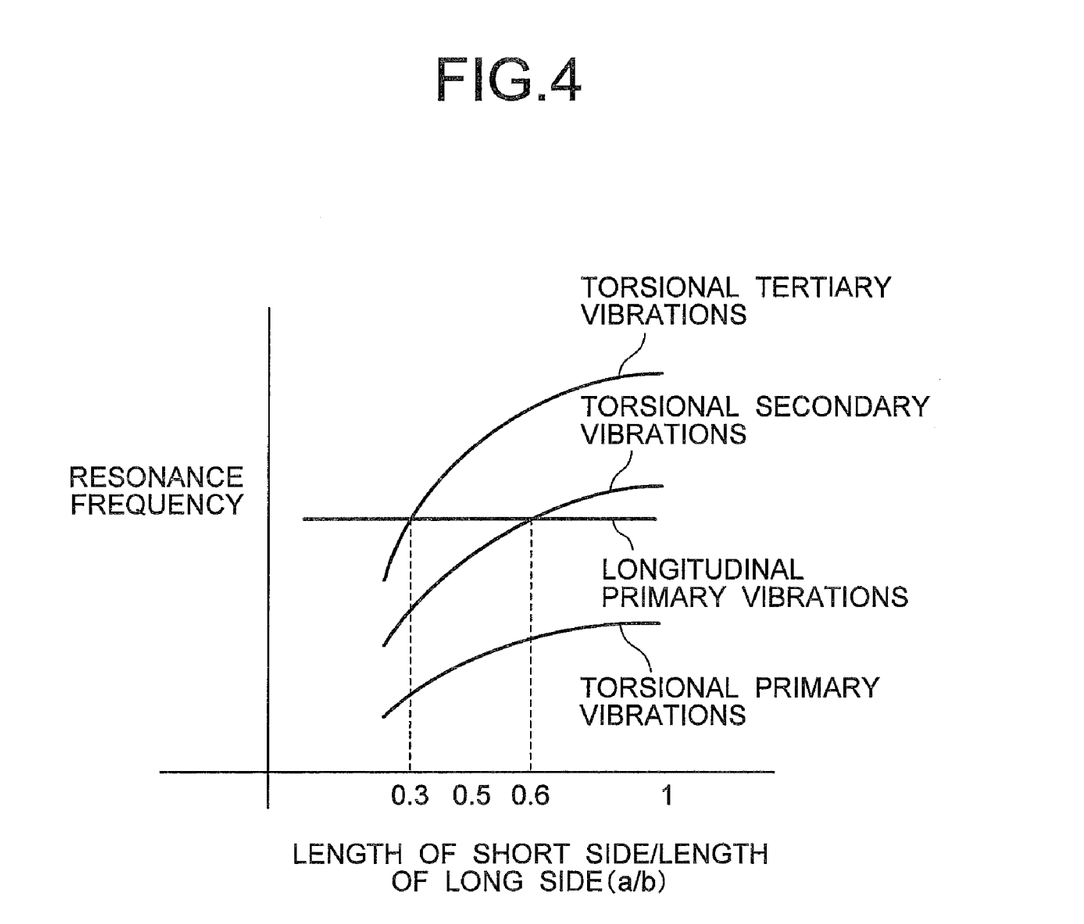
FIG. 4 is a graph that depicts resonance frequencies of each of the modes when a height of the vibrator is fixed and a parameter represented by a length of a short side/a length of a long side is plotted on an axis of abscissa.

In FIGS. 3B to 3E, directions of torsional vibrations are shown by p1 and p2, a direction of longitudinal vibrations is shown by q, and a node of vibrations is shown by N. One node N is present at central positions in a height direction in each of the torsional primary vibration mode (FIG. 3B) and the longitudinal primary vibration mode (FIG. 3C). Two nodes N are present at two positions in the height direction in the torsional secondary vibration mode (FIG. 3D). Three nodes N are present at three positions in the height direction in the torsional tertiary vibration mode (FIG. 3E).

In FIGS. 3B to 3E, a continuous line is used to show a shape of the vibrator 101 before it is subjected to vibrations and a dotted line is used to show the shape of the vibrator 101 after it is subjected to vibrations.

It can be seen from FIG. 4 that, when the parameter a/b is varied, although the resonance frequency of the longitudinal primary vibration mode is constant and does not depend on the parameter a/b, the resonance frequencies of the torsional vibrations increase with an increase in the parameter a/b.

Furthermore, the resonance frequency of the torsional primary vibration mode never matches with the resonance frequency of the longitudinal primary vibration mode irrespective of the value of the parameter a/b. On the contrary, the resonance frequency of the torsional secondary vibration mode matches with the resonance frequency of the longitudinal primary vibration mode near a position where the parameter a/b is 0.6. Moreover, the resonance frequency of the torsional tertiary vibration mode matches with the resonance frequency of the longitudinal primary vibration mode near a position where the parameter a/b is 0.3. Therefore, a and b are set in the vibrator 101 according to the first embodiment such that the parameter a/b falls between 0.25 and 0.35 in longitudinal primary and torsional tertiary vibrations, and falls between 0.5 and 0.6 in longitudinal primary and torsional secondary vibrations.

In the ultrasonic motor 100, the elliptical vibrations are generated by combining longitudinal primary resonance vibrations resulting from expansion and contraction of the vibrator 101 along the central axis 100c (rotation axis) and torsional secondary resonance vibrations or torsional tertiary resonance vibrations resulting from twisting of the vibrator 101 around the central axis 100c. A ratio (proportion) of a and b is set such that the resonance frequencies of the longitudinal primary resonance vibrations resulting from expansion and contraction of the vibrator 101 along the central axis 100c and the torsional secondary resonance vibrations or the torsional tertiary resonance vibrations resulting from twisting of the vibrator 101 around the central axis 100c almost match.

Figure 5:
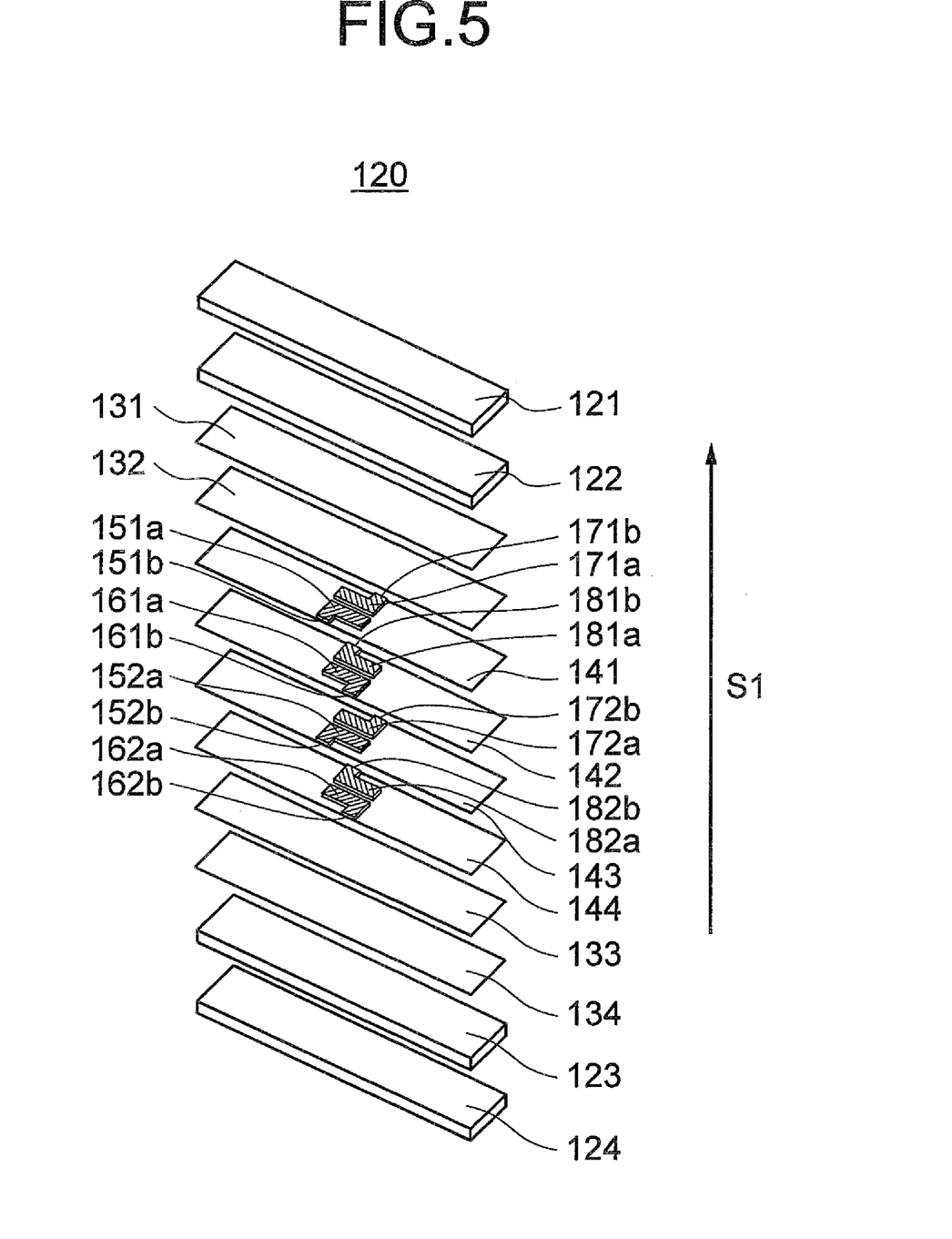
FIG. 5 is an exploded perspective view of a structure of a multilayered piezoelectric element according to the first embodiment of the present invention.
Figure 6:
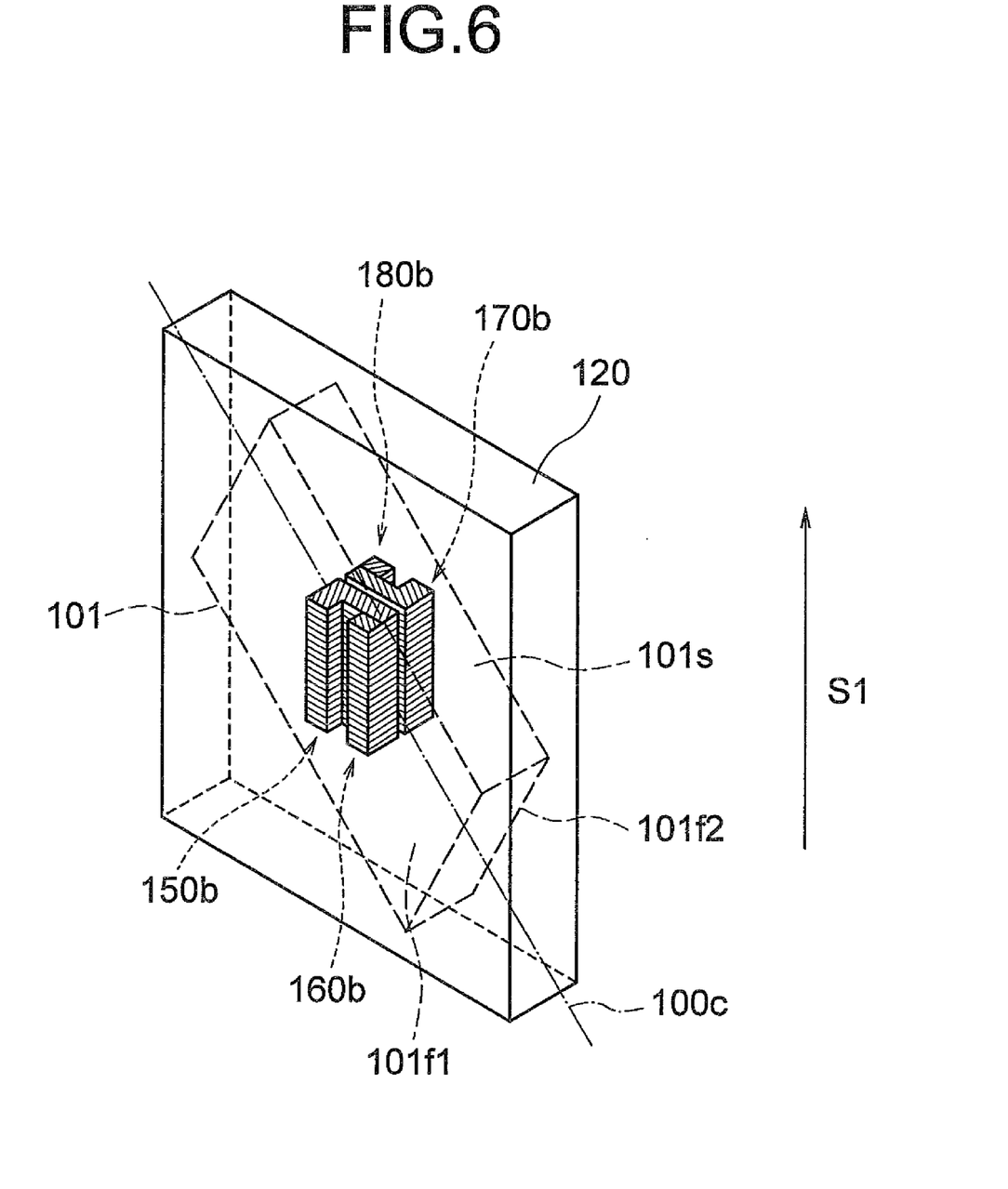
FIG. 6 is a perspective view showing a position at which the vibrator is cut from the multilayered piezoelectric element according to the first embodiment of the present invention.
Figure 7:
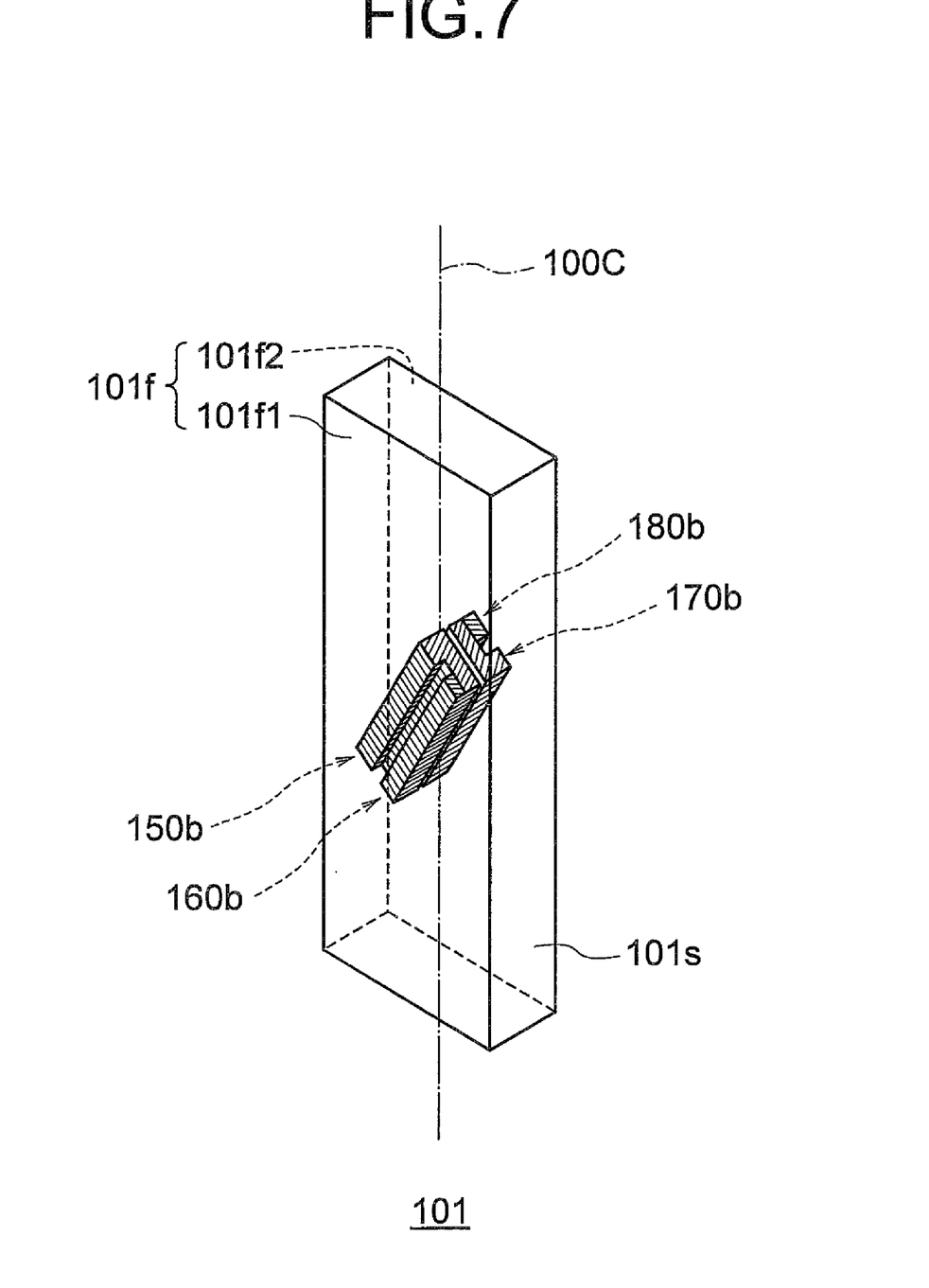
FIG. 7 is a perspective view of a structure of the vibrator that is cut from the multilayered piezoelectric element according to the first embodiment of the present invention.

The vibrator 101 includes a multilayered piezoelectric element 120 in which a plurality of piezoelectric sheets is stacked. The longitudinal primary resonance vibrations and the torsional secondary resonance vibrations or the torsional tertiary resonance vibrations are generated in the vibrator 101 because of formation of activation regions by polarization in a thickness direction of the piezoelectric sheets. The structures of the vibrator 101 and the multilayered piezoelectric element 120 are explained in detail below while referring to FIGS. 5 to 7. FIG. 5 is an exploded perspective view of the structure of the multilayered piezoelectric element 120. FIG. 6 is a perspective view showing a position at which the vibrator 101 is cut from the multilayered piezoelectric element 120. FIG. 7 is a perspective view of the structure of the vibrator 101 that is cut from the multilayered piezoelectric element 120. In FIGS. 6 and 7, internal electrodes of the vibrator 101 are shown as if all the other parts of the vibrator 101 were transparent. Moreover, the vibrator 101 is shown as one structure, i.e., piezoelectric sheets are not shown. The vibrator 101 is first obtained by cutting from the multilayered piezoelectric element 120 and then the friction contact members 103a and 103b are bonded to the top surface of the vibrator 101.

The multilayered piezoelectric element 120 includes, stacked in the height direction (a direction indicated by an arrow S1 in FIG. 5), first piezoelectric sheets 121, 122, 123, and 124, second piezoelectric sheets 131, 132, 133, and 134, and third piezoelectric sheets 141, 142, 143, and 144. The first piezoelectric sheets 121 and 122 are arranged on a topmost side in the height direction and the first piezoelectric sheets 123 and 124 are arranged on a bottommost side in the height direction. The second piezoelectric sheets 131, 132, 133, and 134 are sandwiched between the topmost first piezoelectric sheets 121 and 122 and the bottommost first piezoelectric sheets 123 and 124. The third piezoelectric sheets 141, 142, 143, and 144 are sandwiched between the upper second piezoelectric sheets 131 and 132 and the lower second piezoelectric sheets 133 and 134.

Although the number of sheets in each of the first, second, and third piezoelectric sheets is four in the embodiment shown in FIG. 5, the number of sheets can be varied depending on specifications of the vibrator 101.

The first, second, and third piezoelectric sheets are rectangular and they all have the same planar structure. As the first, second, and third piezoelectric sheets, for example, hard-type lead zirconate titanate piezoelectric elements are used. The third piezoelectric sheets that include the internal electrodes have the activation region formed by polarization in the thickness direction.

In the first, second, and third piezoelectric sheets, the second piezoelectric sheets 131, 132, 133, and 134 and the third piezoelectric sheets 141, 142, 143, and 144 have the same thickness. On the other hand, the first piezoelectric sheets 121, 122, 123, and 124 are thicker than the second and third piezoelectric sheets. The first, second, and third piezoelectric sheets can have the same thickness depending on the specifications of the vibrator 101.

The third piezoelectric sheets 141, 142, 143, and 144 are arranged near a node of the torsional secondary resonance vibrations or the torsional tertiary resonance vibrations of the multilayered piezoelectric element 120. Two sets of the internal electrodes are formed by way of printing on an upper surface of each of the third piezoelectric sheets 141, 142, 143, and 144.

A concrete structure of the internal electrodes and external electrodes is given below.

A – phase (negative phase) first internal electrode 151a and a – phase second internal electrode 171a are arranged in almost a central portion in a longitudinal direction of the third piezoelectric sheet 141 in an opposed manner. The first internal electrode 151a has a protrusion 151b and the –phase second internal electrode 171a has a protrusion 171b. The protrusion 151b and the protrusion 171b extend such that they are exposed to the outside at different locations in the longitudinal direction of the third piezoelectric sheet 141.

A + phase (positive phase) first internal electrode 161a and a + phase second internal electrode 181a are arranged on the third piezoelectric sheet 142 such that, when the third piezoelectric sheet 141 is stacked on the third piezoelectric sheet 142, a position of the + phase first internal electrode 161a corresponds to a position of the – phase first internal electrode 151a and a position of the + phase second internal electrode 181a corresponds to a position of the – phase second internal electrode 171a. The + phase first internal electrode 161a corresponds to the – phase first internal electrode 151a and the + phase second internal electrode 181a corresponds to the – phase second internal electrode 171a. The + phase first internal electrode 161a has a protrusion 161b and the + phase second internal electrode 181a has a protrusion 181b. The protrusion 161b and the protrusion 181b extend such that they are exposed to the outside at different locations in the longitudinal direction of the third piezoelectric sheet 142. Activation regions are formed in the third piezoelectric sheet 141 and the third piezoelectric sheet 142 at least at a place where the – phase first internal electrode 151a and the + phase first internal electrode 161a mutually oppose each other and at a place where the – phase second internal electrode 171a and the + phase second internal electrode 181a mutually oppose each other.

An arrangement of electrodes in the third piezoelectric sheet 143 is the same as that in the third piezoelectric sheet 141. That is, a – phase first internal electrode 152a and a – phase second internal electrode 172a are arranged on the third piezoelectric sheet 143 in an opposed manner. The – phase first internal electrode 152a corresponds to the – phase first internal electrode 151a of the third piezoelectric sheet 141 and the – phase second internal electrode 172a corresponds to the – phase second internal electrode 171a of the third piezoelectric sheet 141. The – phase first internal electrode 152a has a protrusion 152b and the – phase second internal electrode 172a has a protrusion 172b. The protrusion 152b and the protrusion 172b extend such that they are exposed to the outside at different locations in the longitudinal direction of the third piezoelectric sheet 143.

An arrangement of electrodes in the third piezoelectric sheet 144 is the same as that in the third piezoelectric sheet 142. That is, a + phase first internal electrode 162a and a + phase second internal electrode 182a are arranged on the third piezoelectric sheet 144 in an opposed manner. The + phase first internal electrode 162a corresponds to the + phase first internal electrode 161a of the third piezoelectric sheet 142 and the + phase second internal electrode 182a corresponds to the + phase second internal electrode 181a of the third piezoelectric sheet 142. The + phase first internal electrode 162a has a protrusion 162b and the + phase second internal electrode 182a has a protrusion 182b. The protrusion 162b and the protrusion 182b extend such that they are exposed to the outside at different locations in the longitudinal direction of the third piezoelectric sheet 144. Activation regions are formed in the third piezoelectric sheet 143 and the third piezoelectric sheet 144 at least at a place where the − phase first internal electrode 152a and the + phase first internal electrode 162a mutually oppose each other and at a place where the − phase second internal electrode 172a and the + phase second internal electrode 182a mutually oppose each other.

Thus, the internal electrodes are arranged on the third piezoelectric sheets 141, 142, 143, and 144, and the protrusions 151b, 152b, 161b, 162b, 171b, 172b, 181b, and 182b of these internal electrodes are exposed to the outside at different locations in the longitudinal directions of the third piezoelectric sheets 141, 142, 143, and 144. The external electrode is formed on each of the protrusions 151b, 152b, 161b, 162b, 171b, 172b, 181b, and 182b by, for example, printing with a silver paste. The external electrodes formed on the protrusions 151b and 152b constitute a − phase first external electrode group 150b, and the external electrodes formed on the protrusions 161b and 162b constitute a + phase first external electrode group 160b (see FIGS. 6 and 7). Furthermore, the external electrodes formed on the protrusions 171b and 172b constitute a − phase second external electrode group 170b, and the external electrodes formed on the protrusions 181b and 182b constitute a + phase second external electrode group 180b (see FIGS. 6 and 7).

The − phase first external electrode group 150b, the +phase first external electrode group 160b, the − phase second external electrode group 170b, and the + phase second external electrode group 180b are connected to an external power supply (not shown) of the ultrasonic motor 100. An FPC (flexible print circuit) can be used for connecting the external electrode groups to the external power supply. In this case, one end of the FPC is connected to the external electrode groups.

As shown in FIG. 6, the − phase first external electrode group 150b and the + phase first external electrode group 160b are formed on one side surface 101f1 of the vibrator 101, and the − phase second external electrode group 170b and the + phase second external electrode group 180b are formed on the other side surface 101f2 of the vibrator 101. The side surfaces 101f1 and 101f2 include the long sides 101f of a cross-section of the vibrator 101 taken in a direction that is orthogonal to the central axis 100c. The vibrator 101 is formed by cutting from the multilayered piezoelectric element 120. When doing so, the vibrator 101 is cut in such a manner that the central axis 100c of the vibrator 101 is inclined by a certain angle with respect to the direction S1 of stacking of the first, second, and third piezoelectric sheets in the multilayered piezoelectric element 120. The side surfaces of the multilayered piezoelectric element 120 on which the external electrodes are exposed and that are formed by connecting the long sides of the first, second, and third piezoelectric sheets are not cut and they are left behind as the side surfaces 101f1 and 101f2.

It is preferable that the angle at which the vibrator 101 is cut from the multilayered piezoelectric element 120 with respect to the direction S1 is about 45 degrees (see FIG. 6). This angle can be made an angle near the direction S1, in other words, smaller than 45 degrees with respect to the direction S1, when there is a requirement to make the longitudinal vibrations stronger. Further, the angle can be made larger than 45 degrees when there is a requirement to make the torsional vibrations stronger.

It is preferable that there is a phase difference of about 90 degrees between a signal applied to the − phase first external electrode group 150b and the + phase first external electrode group 160b and a signal applied to the − phase second external electrode group 170b and the + phase second external electrode group 180b. In this manner, when the vibrator 101 is cut from the multilayered piezoelectric element 120 in such a manner that a thickness effect of the first, second, and third piezoelectric sheets is oriented obliquely to the vibrator 101, and when the signals that have the phase difference of about 90 degrees are applied to the vibrator 101, the elliptical vibrations are generated on both end surfaces in the height direction of the vibrator 101. These elliptical vibrations are conveyed to the rotor 102 via the friction contact members 103a and 103b. Thus, the vibrator 101 that is made from a single part, has a simple structure, and has no groove or the like can be obtained. Cost reduction can be achieved in the ultrasonic motor 100 that includes the vibrator 101 because of a reduction in the number of parts and an ease in manufacturing. Furthermore, the longitudinal vibrations and the torsional vibrations can be easily generated in the ultrasonic motor 100. The elliptical vibrations are generated by combining these longitudinal vibrations and torsional vibrations, and the rotor 102 is driven by using these elliptical vibrations.

It is not mandatory that the applied signals have the phase difference of about 90 degrees. That is, the phase difference between the applied signals can be set to a desired value, other than 90 degrees, to achieve required motor characteristics.

Second Embodiment

Figure 8:
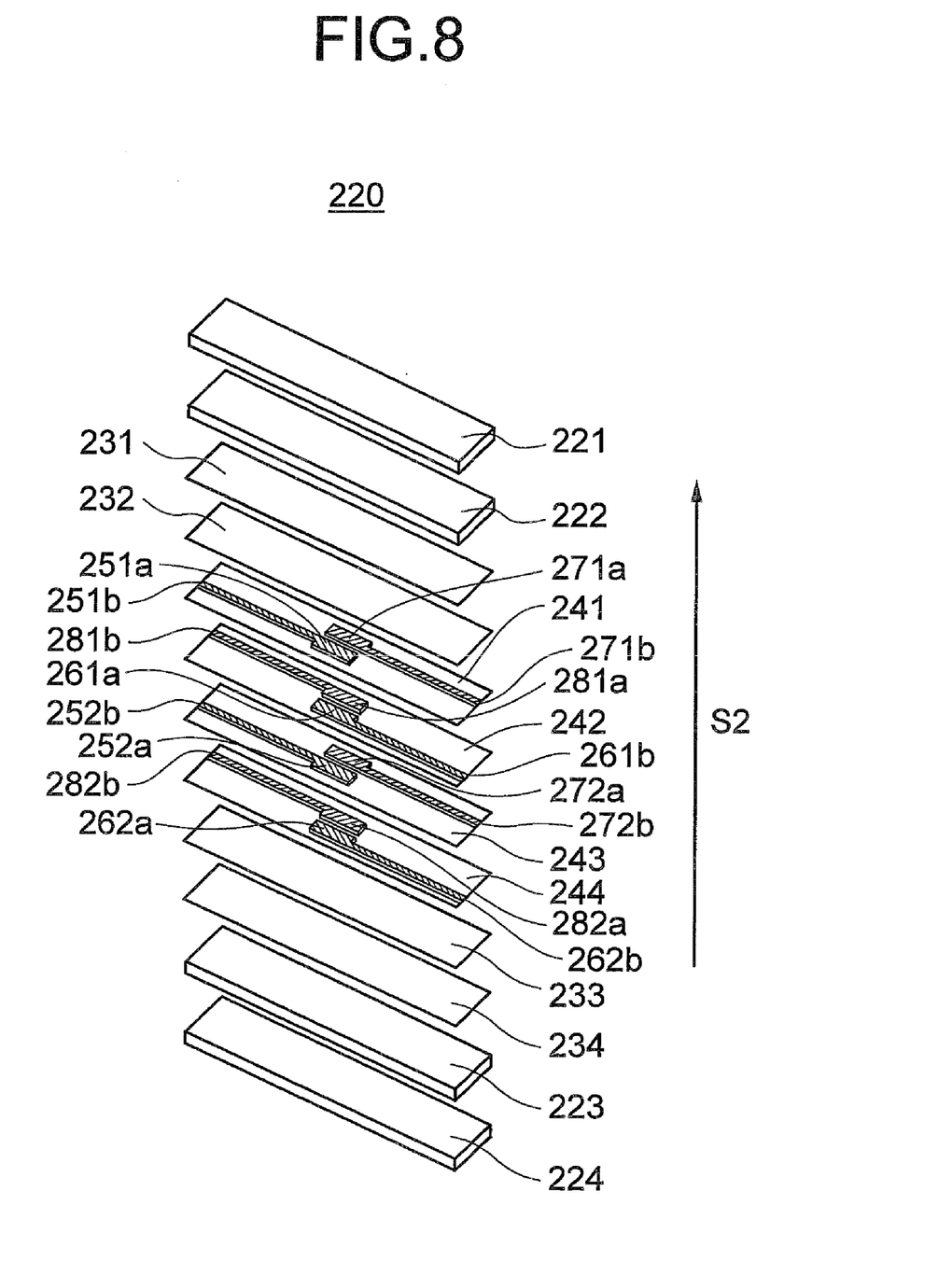
FIG. 8 is an exploded perspective view of a structure of a multilayered piezoelectric element according to a second embodiment of the present invention.
Figure 9:
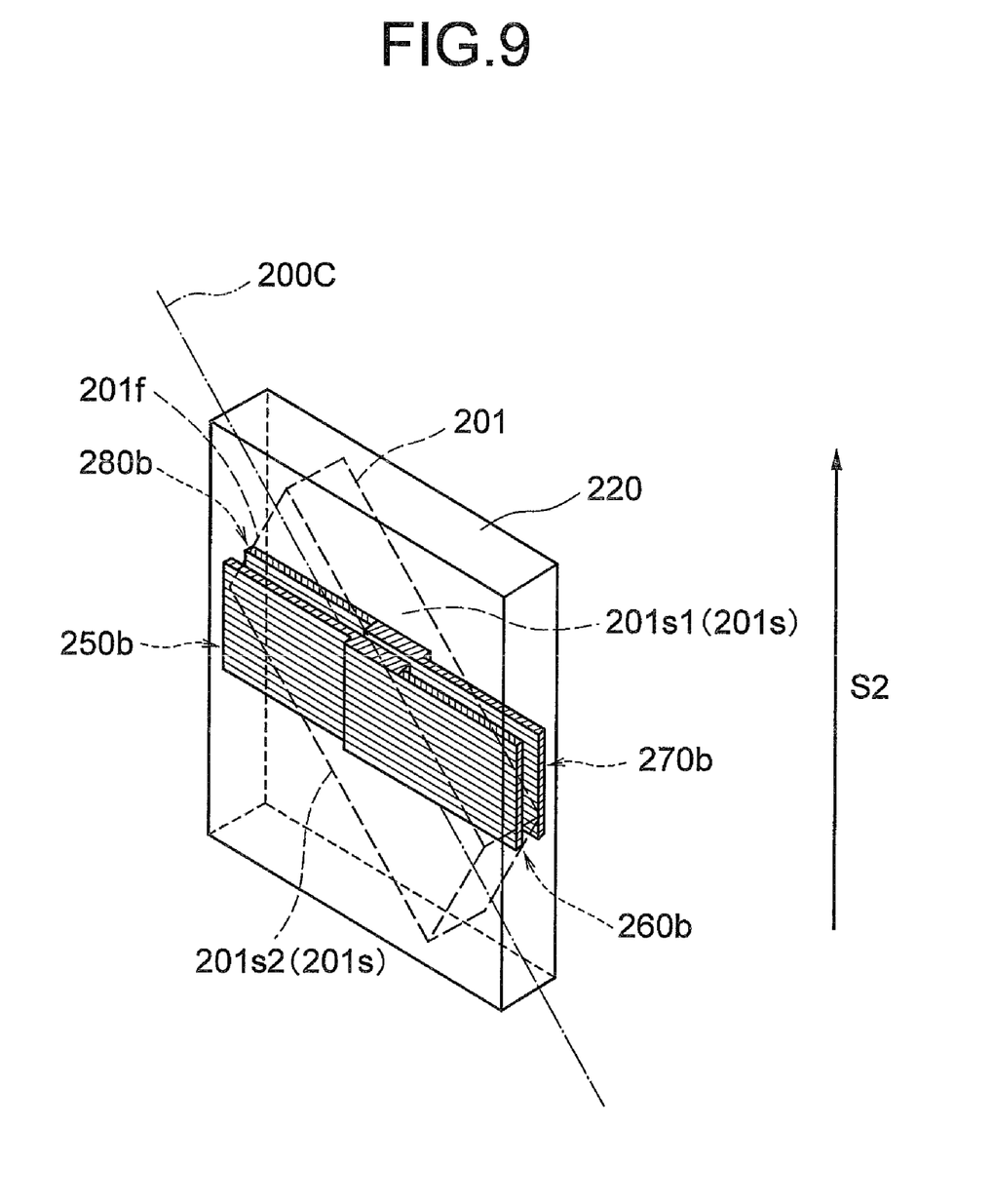
FIG. 9 is a perspective view showing a position at which a vibrator is cut from the multilayered piezoelectric element according to the second embodiment of the present invention.

Next, an ultrasonic motor according to the second embodiment of the present invention is explained while referring to FIGS. 8 and 9.

FIG. 8 is an exploded perspective view of a structure of a multilayered piezoelectric element 220 according to the second embodiment. FIG. 9 is a perspective view showing a position at which a vibrator 201 is cut from the multilayered piezoelectric element 220. In FIG. 9, internal electrodes of the vibrator 201 are shown as if all the other parts of the vibrator 201 were transparent. Moreover, the vibrator 201 is shown as one structure, i.e., piezoelectric sheets are not shown. The vibrator 201 is first obtained by cutting and then friction contact members, which correspond to the friction contact members 103a and 103b, are bonded to a top surface of the vibrator 201 in the same manner as the vibrator 101.

In the vibrator 101 according to the first embodiment, the protrusions of the internal electrodes extend up to the long sides 101f of the cross-sectional surface orthogonal to the central axis 100c of the vibrator 101, and the external electrodes are formed on the protrusions that are exposed to the outside from the long sides 101f.

In contrast, in the vibrator 201 according to the second embodiment, protrusions of the internal electrodes extend up to short sides 201s of the cross-sectional surface orthogonal to a central axis 200c of the vibrator 201, and external electrodes are formed on the protrusions that are exposed to the outside from the short sides 201s.

The vibrator 201 according to the second embodiment is similar in functions to the vibrator 101 according to the first embodiment. Therefore, the vibrator 101 in the ultrasonic motor 100 can be replaced with the vibrator 201 to obtain an ultrasonic motor that is similar in functions as the ultrasonic motor 100. An explanation of this ultrasonic motor is omitted; because, the structure of this ultrasonic motor is the same as that of the ultrasonic motor 100 except that it includes the vibrator 201 instead of the vibrator 101.

The vibrator 201 includes, in the same manner as the vibrator 101 according to the first embodiment, the multilayered piezoelectric element 220 in which a plurality of piezoelectric sheets is stacked. Longitudinal primary resonance vibrations, and torsional secondary resonance vibrations or torsional tertiary resonance vibrations, are generated in the vibrator 201 because of formation of activation regions by polarization in a thickness direction of the piezoelectric sheets.

The multilayered piezoelectric element 220 includes, stacked in a height direction (a direction indicated by an arrow S2 in FIG. 8), first piezoelectric sheets 221, 222, 223, and 224, second piezoelectric sheets 231, 232, 233, and 234, and third piezoelectric sheets 241, 242, 243, and 244. The first piezoelectric sheets 221 and 222 are arranged on a topmost side in the height direction and the first piezoelectric sheets 223 and 224 are arranged on a bottommost side in the height direction. The second piezoelectric sheets 231, 232, 233, and 234 are sandwiched between the topmost first piezoelectric sheets 221 and 222 and the bottommost first piezoelectric sheets 223 and 224. The third piezoelectric sheets 241, 242, 243, and 244 are sandwiched between the upper second piezoelectric sheets 231 and 232 and the lower second piezoelectric sheets 233 and 234.

Although the number of sheets in each of the first, second, and third piezoelectric sheets is four in the embodiment shown in FIG. 8, the number of sheets can be varied depending on specifications of the vibrator 201.

The first, second, and third piezoelectric sheets are rectangular and they all have the same planar structure. As the first, second, and third piezoelectric sheets, for example, hard-type lead zirconate titanate piezoelectric elements are used. The third piezoelectric sheets that include the internal electrodes have the activation region formed by polarization in the thickness direction.

In the first, second, and third piezoelectric sheets, the second piezoelectric sheets 231, 232, 233, and 234 and the third piezoelectric sheets 241, 242, 243, and 244 have the same thickness. On the other hand, the first piezoelectric sheets 221, 222, 223, and 224 are thicker than the second and third piezoelectric sheets. The first, second, and third piezoelectric sheets can have the same thickness depending on the specifications of the vibrator 201.

The third piezoelectric sheets 241, 242, 243, and 244 are arranged near a node of the torsional secondary resonance vibrations or the torsional tertiary resonance vibrations of the multilayered piezoelectric element 220.

Two sets of the internal electrodes are formed by way of printing on an upper surface of each of the third piezoelectric sheets 241, 242, 243, and 244.

A concrete structure of the internal electrodes and external electrodes is given below.

A − phase first internal electrode 251a and a − phase second internal electrode 271a are arranged in almost a central portion in a longitudinal direction of the third piezoelectric sheet 241 in an opposed manner. The − phase first internal electrode 251a has a protrusion 251b and the − phase second internal electrode 271a has a protrusion 271b. The protrusion 251b extends such that it is exposed to the outside from one short side of the third piezoelectric sheet 241, and the protrusion 271b extends such that it is exposed to the outside from the other short side of the third piezoelectric sheet 241.

A + phase first internal electrode 261a and a + phase second internal electrode 281a are arranged on the third piezoelectric sheet 242 such that, when the third piezoelectric sheet 241 is stacked on the third piezoelectric sheet 242, a position of the + phase first internal electrode 261a corresponds to a position of the − phase first internal electrode 251a and a position of the + phase second internal electrode 281a corresponds to a position of the − phase second internal electrode 271a. The + phase first internal electrode 261a corresponds to the − phase first internal electrode 251a and the + phase second internal electrode 281a corresponds to the − phase second internal electrode 271a. The + phase first internal electrode 261a has a protrusion 261b and the + phase second internal electrode 281a has a protrusion 281b. The protrusion 261b and the protrusion 281b extend such that they are exposed to the outside from different short sides of the third piezoelectric sheet 242. Activation regions are formed in the third piezoelectric sheet 241 and the third piezoelectric sheet 242 at least at a place where the − phase first internal electrode 251a and the + phase first internal electrode 261a mutually oppose each other and at a place where the − phase second internal electrode 271a and the + phase second internal electrode 281a mutually oppose each other.

An arrangement of electrodes in the third piezoelectric sheet 243 is the same as that in the third piezoelectric sheet 241. That is, a − phase first internal electrode 252a and a − phase second internal electrode 272a are arranged on the third piezoelectric sheet 243 in an opposed manner. The − phase first internal electrode 252a corresponds to the − phase first internal electrode 251a of the third piezoelectric sheet 241 and the − phase second internal electrode 272a corresponds to the − phase second internal electrode 271a of the third piezoelectric sheet 241. The − phase first internal electrode 252a has a protrusion 252b and the − phase second internal electrode 272a has a protrusion 272b. The protrusion 252b and the protrusion 272b extend such that they are exposed to the outside from different short sides of the third piezoelectric sheet 243.

An arrangement of electrodes in the third piezoelectric sheet 244 is the same as that in the third piezoelectric sheet 242. That is, a + phase first internal electrode 262a and a + phase second internal electrode 282a are arranged on the third piezoelectric sheet 244 in an opposed manner. The + phase first internal electrode 262a corresponds to the + phase first internal electrode 261a of the third piezoelectric sheet 242 and the + phase second internal electrode 282a corresponds to the + phase second internal electrode 281a of the third piezoelectric sheet 242. The + phase first internal electrode 262a has a protrusion 262b and the + phase second internal electrode 282a has a protrusion 282b. The protrusion 262b and the protrusion 282b extend such that they are exposed to the outside from different short sides of the third piezoelectric sheet 244. Activation regions are formed in the third piezoelectric sheet 243 and the third piezoelectric sheet 244 at least at a place where the − phase first internal electrode 252a and the + phase first internal electrode 262a mutually oppose each other and at a place where the − phase second internal electrode 272a and the + phase second internal electrode 282a mutually oppose each other.

Thus, the internal electrodes are arranged on the third piezoelectric sheets 241, 242, 243, and 244, and the protrusions 251b, 252b, 261b, 262b, 271b, 272b, 281b, and 282b of these internal electrodes are exposed to the outside from different short sides of the third piezoelectric sheets 241, 242, 243, and 244. The external electrode is formed on each of the protrusions 251b, 252b, 261b, 262b, 271b, 272b, 281b, and 282b by, for example, printing with a silver paste. The external electrodes formed on the protrusions 251b and 252b constitute a − phase first external electrode group 250b, and the external electrodes formed on the protrusions 261b and 262b constitute a + phase first external electrode group 260b (see FIG. 9). Furthermore, the external electrodes formed on the protrusions 271b and 272b constitute a − phase second external electrode group 270b, and the external electrodes formed on the protrusions 281b and 282b constitute a + phase second external electrode group 280b (see FIG. 9).

The − phase first external electrode group 250b, the +phase first external electrode group 260b, the − phase second external electrode group 270b, and the + phase second external electrode group 280b are connected to an external power supply (not shown) of the ultrasonic motor. An FPC can be used for connecting the external electrode groups to the external power supply. In this case, one end of the FPC is connected to the external electrode groups.

As shown in FIG. 9, the + phase first external electrode group 260b and the − phase second external electrode group 270b are formed on one side surface 201s1 of the vibrator 201, and the − phase first external electrode group 250b and the + phase second external electrode group 280b are formed on the other side surface 201s2 of the vibrator 201. The side surfaces 201s1 and 201s2 include the short sides 201s of a cross-section of the vibrator 201 taken in a direction that is orthogonal to a central axis 200c. The vibrator 201 is formed by cutting from the multilayered piezoelectric element 220. When doing so, the vibrator 201 is cut in such a manner that the central axis 200c of the vibrator 201 is inclined by a certain angle with respect to the direction S2 of stacking of the first, second, and third piezoelectric sheets in the multilayered piezoelectric element 220. The side surfaces of the multilayered piezoelectric element 220 on which the external electrodes are exposed and that are formed by connecting the long sides of the first, second, and third piezoelectric sheets are not cut and they are left behind as side surfaces constituting the side surface 201f.

It is preferable that there is a phase difference of about 90 degrees between a signal applied to the − phase first external electrode group 250b and the + phase first external electrode group 260b and a signal applied to the − phase second external electrode group 270b and the + phase second external electrode group 280b. In this manner, when the vibrator 201 is cut from the multilayered piezoelectric element 220 in such a manner that a transverse effect of the first, second, and third piezoelectric sheets is oriented obliquely to the vibrator 201, and when the signals that have the phase difference of about 90 degrees are applied to the vibrator 201, elliptical vibrations are generated on both end surfaces in the height direction of the vibrator 201.

The ultrasonic motor according to the second embodiment is more efficient (such as a fast driving motor); because, a larger displacement can be obtained in this ultrasonic motor by use of length vibrations by including the piezoelectric element that has the transverse effect.

Other structures, effects, and advantages are the same as that according to the first embodiment.

Thus, the ultrasonic motors according to the embodiments are advantageous in that they are made from single parts, have simple structures, and have no grooves or the like. Furthermore, the longitudinal vibrations and the torsional vibrations can be easily generated in these ultrasonic motors, the elliptical vibrations are generated by combining these longitudinal vibrations and torsional vibrations, and the rotor is driven by using these elliptical vibrations.

In this manner, the ultrasonic motors according to the embodiments can be used as ultrasonic motors that generate the elliptical vibrations by combining the longitudinal vibrations and the torsional vibrations, and in which the rotor is driven by using these elliptical vibrations.

Although the invention has been described with respect to specific embodiments for a complete and clear disclosure, the appended claims are not to be thus limited, but are to be construed as embodying all modifications and alternative constructions that may occur to one skilled in the art that fairly fall within the basic teaching herein set forth.

What is claimed is:

1. An ultrasonic motor comprising:
    a vibrator having a dimension ratio of a rectangle in a cross-section orthogonal to a central axis; and
    a rotor that contacts an elliptical vibrations generating surface of the vibrator and that is rotation driven around the central axis, as a rotation axis, that is orthogonal to an elliptical vibrations generating surface, wherein
    elliptical vibrations are generated by combining longitudinal primary resonance vibrations resulting from expansion and contraction of the vibrator in a direction of the central axis and torsional secondary resonance vibrations or torsional tertiary resonance vibrations resulting from twisting of the vibrator around the central axis,
    the dimension ratio of the rectangle of the vibrator is set such that a resonance frequency of the longitudinal primary resonance vibrations and a resonance frequency of the torsional secondary resonance vibrations or the torsional tertiary resonance vibrations almost match,
    the vibrator includes a plurality of piezoelectric sheets, and
    the longitudinal primary resonance vibrations and the torsional secondary resonance vibrations or the torsional tertiary resonance vibrations are generated because of formation of activation regions by polarization in a thickness direction of the piezoelectric sheets,
    the vibrator is obtained by stacking the plurality of piezoelectric sheets in a direction which has a component along a direction of the rotation axis and a component along a rotation direction of the rotor,
    a first internal electrode is arranged on each piezoelectric sheet among the piezoelectric sheets that is near a mode of the torsional secondary resonance vibrations or the torsional tertiary resonance vibrations, and
    the activation regions are formed at least at places where the first internal electrodes mutually oppose each other.

2. The ultrasonic motor according to claim 1, wherein
    a second internal electrode is arranged on each piezoelectric sheet on which the first internal electrode is arranged, and
    activation regions that are polarized in mutually opposite directions are formed corresponding to each of the places where the first internal electrodes mutually oppose each other and places where the second internal electrodes mutually oppose each other.

* * * * *